United States Patent [19]

Kimura

[11] 4,291,414
[45] Sep. 22, 1981

[54] RADIO RECEIVER OPERABLE IN STATION SEARCH MODE OR STATION SELECT MODE

[75] Inventor: Shigenobu Kimura, Hamamatsu, Japan

[73] Assignee: Nippon Gakki Seizo Kabushiki Kaisha, Hamamatsu, Japan

[21] Appl. No.: 145,349

[22] Filed: Apr. 30, 1980

[30] Foreign Application Priority Data

May 2, 1979 [JP] Japan .................................. 54-54509
May 2, 1979 [JP] Japan .................................. 54-54510

[51] Int. Cl.³ ............................................. H03J 7/26
[52] U.S. Cl. ................................... 455/164; 455/184; 455/186
[58] Field of Search ............... 455/184, 185, 186, 195, 455/179, 196, 160, 147, 169, 265, 259, 258, 260, 264, 182, 192, 164; 329/122; 331/1 R, 1 A, 18, 19, 23, 34

[56] References Cited

U.S. PATENT DOCUMENTS

| | | | |
|---|---|---|---|
| 3,922,609 | 11/1975 | Grohman | 455/184 |
| 3,947,774 | 3/1976 | Glennon | 455/169 |
| 3,988,681 | 10/1976 | Schurmann | 455/184 |
| 4,201,943 | 5/1980 | Klank | 455/185 |
| 4,205,270 | 5/1980 | Okatani | 455/186 |
| 4,207,531 | 6/1980 | Ito | 455/184 |

Primary Examiner—Jin F. Ng
Assistant Examiner—Tommy P. Chin
Attorney, Agent, or Firm—Frishauf, Holtz, Goodman and Woodward

[57] ABSTRACT

A radio receiver comprising a local oscillator, a first counter circuit for computing an algebraic sum of a number corresponding to an oscillating frequency of the local oscillator and a number corresponding to an intermediate frequency, the algebraic sum representing frequency information for a tuned input signal frequency of the receiver, a memory circuit for storing frequency information produced by the counter when the receiver is tuned to a broadcast station in a station search mode, a digital comparator for comparing the frequency information read out of the memory circuit with the frequency information of the counter in a station select mode, and a charge pump and lowpass filter responsive to the digital comparator to control a local oscillator frequency of the local oscillator so that the frequency information of the counter becomes coincident with the frequency information from the memory circuit. A second counter is provided for counting clock pulses in the station search mode. The output signal of the second counter is compared with the output signal of the first counter by the digital comparator. The station frequency information read out of the memory circuit in the station select mode may be programmed in the second counter.

6 Claims, 3 Drawing Figures

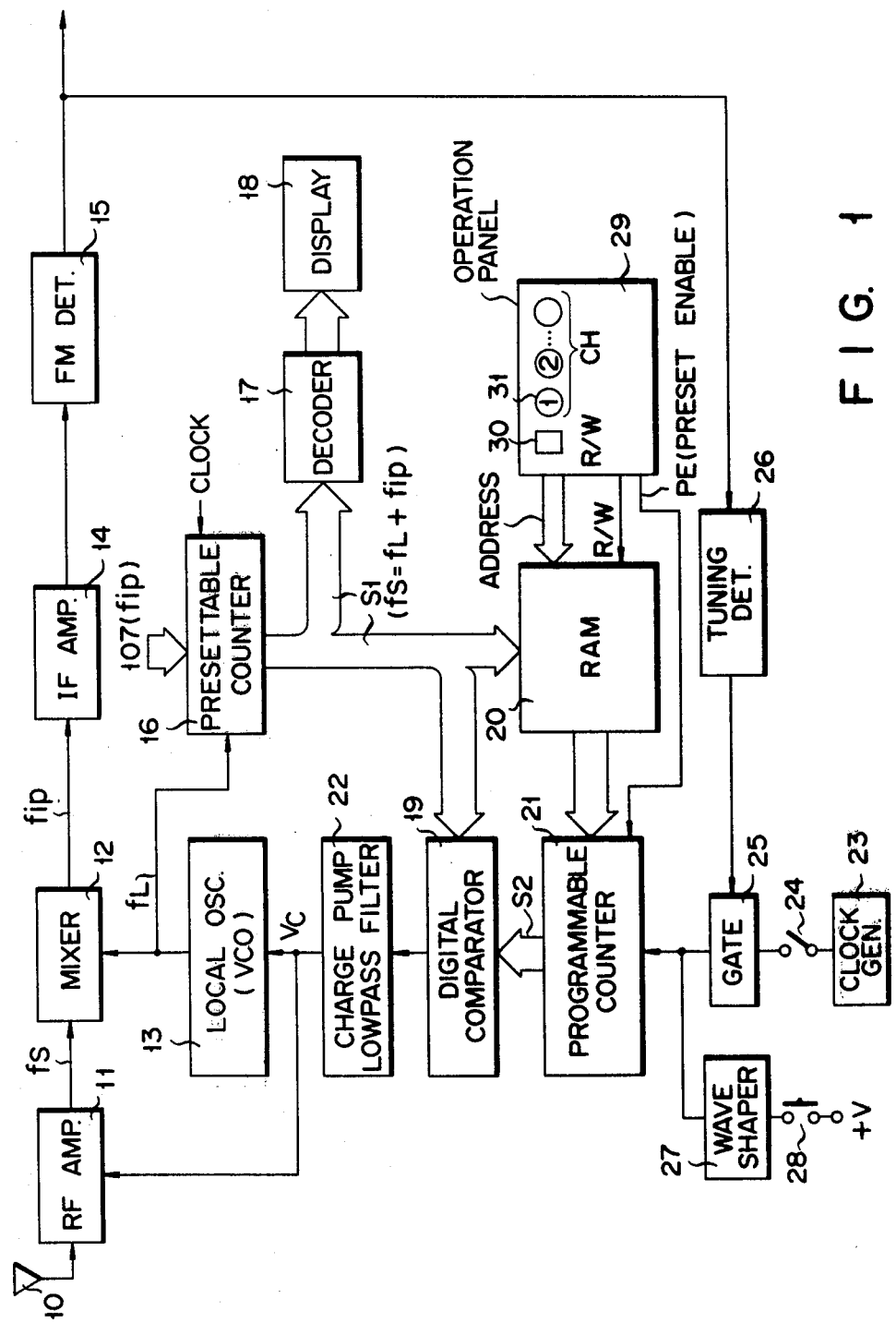
F I G. 1

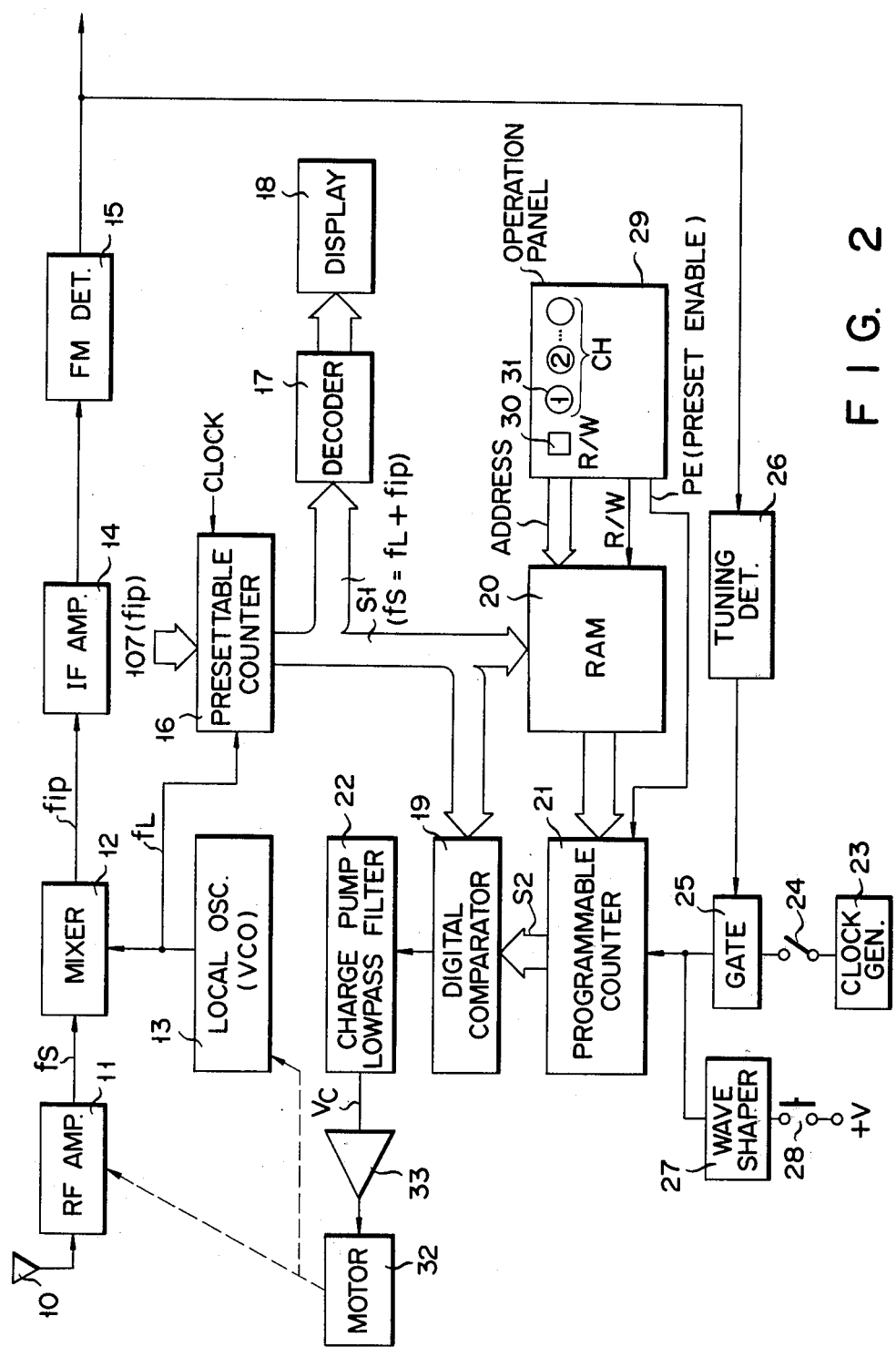
F I G. 2

RADIO RECEIVER OPERABLE IN STATION SEARCH MODE OR STATION SELECT MODE

BACKGROUND OF THE INVENTION

The present invention relates to a radio receiver and, more particularly, to a radio receiver selectively operable in a station search mode or a station select mode.

In a conventional voltage synthesizer type radio receiver operable in a station search mode (automatic scanning mode) or a station select mode (presetting mode), a ramp voltage from a ramp generator is supplied to a voltage-controlled local oscillator through a hold circuit in the station search mode, thereby to change a local frequency. Through a continuous change of the oscillating frequency of voltage-controlled local oscillator, a receiving frequency band is automatically scanned and, when the receiver is tuned to a broadcast signal, a tuning detecting means causes the hold circuit to hold a magnitude of the ramp voltage at the tuning time. In the station select mode, the frequency information for a broadcast station stored in a memory is converted into a corresponding DC voltage by a digital-to-analog converter which in turn is applied to the local oscillator. In this way, the receiver is tuned to the selected broadcast station.

In the above-mentioned voltage synthesizer type receiver, when the oscillating frequency of the local oscillator changes in accordance with temperature, etc., the receiver is caused to be detuned.

SUMMARY OF THE INVENTION

A receiver according to this invention is comprised of frequency variable local oscillator means for producing a local oscillator frequency signal, mixer means for producing an intermediate frequency signal by mixing the local oscillator frequency signal with a receiving input signal, computing means for computing an algebraic sum of a number corresponding to a local oscillator frequency and a fixed number corresponding to the intermediate frequency, memory means for storing frequency information for a plurality of broadcasting stations, a digital comparing means for comparing the frequency information for a broadcasting station read out of the memory means in the station search mode with the frequency information produced by the computing means, and means responsive to the digital comparing means to control the oscillating frequency of the local oscillator means so that the frequency information of the computing means becomes coincident with the frequency information read out of the memory means.

The computing means computes the sum of 107 and the number corresponding to a local oscillator frequency for meeting the Japanese FM broadcasting standard which employs a lower local system in which the local oscillator frequency is 10.7 MHz (intermediate frequency) below a receiving input signal frequency. The computing means computes a difference between 107 and the number corresponding to a local oscillator frequency for meeting the U.S. FM broadcasting standard employing the upper local system in which the local oscillator frequency is 10.7 MHz above a receiving input signal frequency. Practically, the computing means is comprised of a presetable counter circuit which is preset with 107 for reception of the Japanese FM broadcast and arranged to up-count the local oscillator frequency signal for $10^{-5}$ sec. For receiving the U.S. FM broadcasts, the counter circuit may be preset with 9893 ($=-107$) and is arranged to up-count the local oscillator frequency signal for $10^{-5}$ sec.

A receiver is further provided with a counter circuit for counting, in the station search mode, clock pulses from a clock pulse generator between numbers corresponding to extremities of a receiving broadcast frequency band. In the station search mode, the output signal of this counter circuit is applied to the digital comparing means where it is compared with the output signal of the computing means. When the receiver is tuned to a broadcasting station, a tuning detecting means disables this counter circuit from counting of the clock pulses from the clock pulse generator.

When the receiver is tuned to a broadcasting station, the frequency information of the station is loaded into the memory means from the computing means. A programmable counter may be used for this counter circuit in order to program the frequency information read out of the memory means into the counter in the station select mode.

BRIEF DESCRIPTION OF THE DRAWINGS

FIGS. 1 and 2 are schematic block diagrams of a radio receiver according to the invention.

DESCRIPTION OF THE PREFERRED EMBODIMENTS

Figure 3:
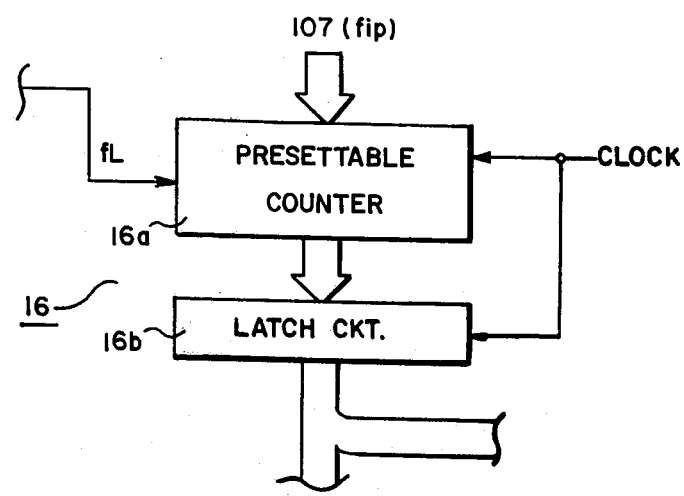
FIG. 3 illustrates the presettable counter of FIGS. 1 and 2 in greater detail.

Referring to FIG. 1, there is shown in block form an FM radio receiver which is an embodiment according to the invention. In the receiver, an FM broadcast signal with a carrier frequency of $f_s$ received by an antenna 10 is amplified by a radio frequency (RF) amplifier 11 and is then applied to a mixer 12 where it is mixed with a local oscillator frequency signal from a voltage-controlled local oscillator (VCO) 13 to produce an intermediate frequency FM signal with a carrier frequency $f_{ip}$ of 10.7 MHz as in conventional FM radio receivers. The intermediate frequency signal is amplified by an intermediate frequency amplifier 14 and then is applied to an FM detector or discriminator 15 where a monophonic audio signal or stereophonic composite signal is recovered.

Tuning capacitors incorporated in the radio frequency amplifier 11 and the local oscillator 13 are comprised of varactor diodes. The invention will be described hereinafter in connection with a radio receiver adapted for the lower local system in which the local frequency is 10.7 MHz below the receiving input signal frequency and the FM broadcasting band 76.0 MHz to 90.0 MHz in accordance with the Japanese FM broadcasting standard. Accordingly, the local oscillator 13 is so designed that the output signal frequency (local oscillator frequency) $f_L$ is changed over a range from 65.3 MHz to 79.3 MHz by a control voltage Vc applied thereto.

As shown, the local oscillator frequency signal of the local oscillator 13 is applied to a presettable counter circuit 16 in addition to the mixer 12. The presettable counter circuit 16, after being preset with a number 107 corresponding to the intermediate frequency 10.7 MHz, up-counts the output signal from the local oscillator 13 for a given period of time of $10^{-5}$ sec, thereby to compute an algebraic sum of the preset value 107 ($f_{ip}$) and a three-figure number consisting of values of 100 KHz, 1 MHz and 10 MHz orders of a local oscillator frequency $f_L$, e.g. 789 for a local oscillator frequency of 78.9 MHz. Namely, the algebraic sum ($f_L + f_{ip}$) represents frequency information for a tuned frequency ($f_s$) of the receiver. The counter circuit 16 provides the result of the computation in the form of a BCD signal S1. In the above example, the BCD signal S1 represents 896 which corresponds to the present tuned input signal frequency of the receiver, that is, 89.6 MHz. Practically, as shown in FIG. 3, the presettable counter circuit 16 may comprise a presettable counter 16a responsive to application of a clock pulse thereto to be repeatedly preset with 107 at the period of the clock pulse, and a latch circuit 16b for latching the contents of the counter after completion of the counting of the local oscillator frequency signal by the presettable counter 16a. Further, the presettable counter 16a may be constructed by connecting three decade counters such as Motorola MC 14510 in cascade fashion.

The output BCD signal S1 of the presettable counter circuit 16 is applied to a decoder 17 coupled with a digital display 18 where a number corresponding to $f_s = f_L + f_{ip}$ in the counter circuit 16, or a tuned input signal frequency of the receiver is visually indicated. The output BCD signal S1 of the counter circuit 16 is always supplied to a digital comparator 19. In the presetting mode, the BCD signal S1 is applied as station frequency information to a random access memory (RAM) 20 to be stored therein.

The digital comparator 19 is arranged to compare in magnitude the output BCD signal S1 of the presettable counter circuit 16 with an output BCD signal S2 of a programmable counter 21 having bits respectively corresponding to bits of the output BCD signal S1, and provide one of tri-state outputs, "open (high impedance)", "1" and "0", on the basis of the comparing result. For example, the output state of the digital comparator 19 is "open" when S1=S2, "1" when S2>S1, and "0" when S2<S1. the output signal of the comparator 19 is applied to a charge pump/lowpass filter 22 to form a control voltage Vc to be applied to the varactor diodes in the RF amplifier 11 and VCO 13. When the output state of the digital comparator 19 is "1" or "0", the magnitude of the control voltage Vc continuously changes increasingly or decreasingly. As a result, the resonance frequency of the tuned circuit of the RF amplifier 11, or the tuned input signal frequency of the receiver, and the oscillating frequency of VCO 13 (local oscillator frequency) are continuously changed increasingly or decreasingly by the changing control voltage Vc. During a period of time that the oscillating frequency of the VCO 13 changes, the BCD signal S1 of the presettable counter circuit 16 changes at the period of the clock signal applied. The change of the control voltage Vc continues until the output BCD signal S1 becomes coincident with the output BCD signal S2 from the programmable counter 21.

The programmable counter 21 is comprised of a programmable up/down counter which counts a clock signal externally applied thereto in the automatic scanning mode within a range from 760 to 900 and programs therein station frequency information read out of RAM 20 in the presetting mode. The programmable counter 21 is so arranged as to be capable of automatically inverting its counting direction (up or down) when the count of the counter reaches an extremity of the counting range (760 to 900) and manually inverting its counting direction at any point within the counting range. The programmable up/down counter may be designed by using the aforesaid Motorola MC 14510 decade counters, like the auto scanner disclosed in U.S patent application Ser. No. 973,631 entitled "AUTOMATIC FREQUENCY SCANNING RADIO RECEIVER", filed Dec. 27, 1978, and assigned to the same assignee as the present invention. Preset data terminals of the counter circuit 21 are connected to output data bus of RAM 20.

The programmable counter 21 is supplied with a clock pulse from a clock pulse generator 23 through a gate circuit 25 during the automatic scanning mode in which a station search switch 24 of lock type is closed. The clock pulse has a much lower frequency than the clock pulse applied to the presettable counter circuit 16. The gate circuit 25 is disabled when the receiver is tuned to a station in response to an output signal of a tuning detection circuit 26 connected to the output of FM detector 15. When the receiver is tuned to a station, the output BCD signal S1 of the presettable counter circuit 16 is equal to the output BCD signal S2 of the programmable counter 21. The tuning detection circuit 26 may be constructed like the mute and scan control circuit disclosed in the above-mentioned U.S. Patent application.

In the manual scan mode, to the programmable counter 21 is applied one pulse signal from a waveshaper 27 connected to a power source (+V) each time a manual scanning switch 28 of nonlock push button type is depressed.

The receiver is provided with an operation panel 29 having thereon an R/W switch 30 of lock type and a plurality of channel selection switches 31 of lock type which are associated with a control circuit (not shown). The control circuit is so arranged as to apply to RAM 20, when the R/W switch 30 is depressed, a R/W signal to set RAM 20 to write mode and, when one of channel selection switches 31 is depressed, an address signal designating a memory location in RAM 20 for the channel selected by the channel selection switch 31 depressed. Accordingly, after the receiver is tuned to one broadcasting station in the station search mode, the numerical informatiom (e.g. 800 for a station frequency of 80.0 MHz) representing the frequency of the broadcasting station from the presettable counter circuit 16 can be written into RAM 20. Thus, the frequency information for a plurality of broadcasting stations may be preset into a plurality of memory locations of RAM 20. In the read mode or the station select mode, the R/W switch 30 is released. In this state, if one of the channel selection switches 31 is depressed, the frequency of the broadcasting station selected is read out of RAM 20 and a preset enable signal PE is applied to the programmable counter 21. As a result, the frequency information read out of RAM 20 is loaded into the programmable counter 21. In the present embodiment, the receiver is so arranged that when a power is first applied to the receiver, specific numerical information (a number within the range 760 to 900, for example, 800) may be loaded from RAM 20 into the programmable counter 21.

The operation of the receiver thus constructed will be described. Assume now that the station search switch 24 is opened, the receiver is not tuned to a broadcasting station, and the count of the counter 21 is 780, for example. In this case, the oscillating frequency $f_L$ of VCO 13 is 67.3 MHz, and thus the count of the counter circuit 16 is 780. When the station search switch 24 is closed, the receiver is set to the automatic scanning mode or the station search mode and the prorammable counter 21 counts the clock pulse from the clock pulse generator 23 in the up or down counting direction. As a result, the count of the programmable counter 21 changes one by one so that the output frequency $f_L$ of VCO 13 changes so as to make the output BCD signal S1 of the presettable counter circuit 16 coincident with the output BCD signal S2 of the programmable counter 21. With the change of the count of the counter 21, the tuned frequency of the receiver as well as the oscillating frequency $f_L$ of VCO 13 change. And when the receiver is tuned to the broadcasting station of 80.0 MHz, for example, the output signal of the tuning detection circuit 26 disables the gate circuit 25, so that the count of the counter 21 and the output frequency $f_L$ of VCO 13 are fixed to allow the receiver to receive the broadcasting station of 80.0 MHz, continuously.

For reception of a broadcasting station adjacent to the 80.0 MHz station, it is only necessary to apply one shot of pulse to the counter 21 from the waveshaper 27 by closing the switch 28 while the switch 24 is closed. By so doing, the count of the counter 21 changes to cause the tuned input signal frequency of the receiver and the output frequency $f_L$ of VCO 13 to change. Accordingly, the receiver is detuned from the broadcasting station of 80.0 MHz to enable the gate circuit 25 again. As a result, the above-mentioned search operation is performed until the adjacent broadcasting station is received.

In receiving a broadcasting station with a low receiving signal level, the tuning detection circuit 26 fails to disable the gate circuit 25. In this case, such a station may be received by repeatedly operating the manual scanning switch 28 with the station search switch 24 left open.

For the preset selection of a broadcasting station, it is necessary to store into RAM 20 the output frequency information of the counter circuit 16 obtained when each broadcasting station is received in the station search mode. The frequency information for a plurality of broadcasting stations stored in RAM 20 may be selectively programmed into the programmable counter 21 through operation of the channel selection switch 31. The tuned input signal frequency of the receiver and the oscillating frequency $f_L$ of the VCO 13 change in accordance with frequency information selectively programmed in the counter 21 until the output BCD signal S1 of the presettable counter circuit 16 is coincident with the BCD signal S2 programmed into the counter 21, in other words, the broadcasting station selected is received.

In the illustrated embodiment, the frequency information from RAM 20 is supplied to the digital comparator 19 through the programmable counter 21. Alternatively, the frequency information may be supplied to the comparator 19 through a selection gate circuitry to which the output signal of the counter 21 is also applied.

There will now be described the prevention of variations in the tuned input signal frequency of the receiver and the oscillating frequency $f_L$ of VCO 13 due to a change in temperature. When the receiver receives the 80.0 MHz broadcasting station, the oscillating frequency ($f_L$) of VCO 13 is 69.3 MHz and the BCD signals S1 and S2 represent both "800". Under this condition, when the oscillating frequency $f_L$ changes from 69.3 MHz to 69.5 MHz, the tuned input signal frequency changes from 80.0 MHz to 80.2 MHz and to BCD signal S1 changes from 800 to 802. However, the BCD signal S2 keeps its value irrespective of temperature change and thus has still "800". Accordingly, since S1≠S2, the control voltage Vc changes to cause the oscillating frequency $f_L$ of VCO 13 to be changed until the signals S1 and S2 become equal to each other. In other words, the tuned input signal frequency is corrected from 80.2 MHz to 80.0 MHz and the oscillating frequency $f_L$ of VCO 13 is corrected from 69.5 MHz to 69.3 MHz, so that the receiver is tuned correctly to the 80.0 MHz broadcasting station.

Turning now to FIG. 2, there is shown another embodiment of the radio receiver according to the invention. In this figure, like reference numerals are used to designate like parts in FIG. 1, and the description thereof is omitted. In the embodiment, mechanical variable capacitors having a rotary shaft are used for the variable capacitors for changing the tuned frequency of an RF amplifier 11 and the oscillating frequency $f_L$ of VCO 13. The rotary shafts of those variable capacitors are rotated by a motor 32 driven by a motor drive circuit 33 receiving a control voltage Vc from a charge pump/lowpass filter 22.

The present invention, which has been described in connection with the lower local system, may of course be applied to the upper local system in which the local frequency is higher than the receiving frequency. According to the U.S. FM broadcasting standard, the FM broadcasting frequency band ranges from 88.0 MHz to 108.0 MHz and the range of the local oscillator frequency is 98.7 MHz to 118.7 MHz. Accordingly, in order to satisfy the U.S. FM broadcasting standard, the presettable counter circuit 16 may be arranged to compute a difference between a number corresponding to the local oscillator frequency and a fixed number corresponding to the intermediate frequency 10.7 MHz, namely, an algebraic sum of a number corresponding to the local oscillator frequency and $-107$. Practically, the presettable counter circuit 16 may be arranged to be preset with 9893 ($=-107$) and up-count the local oscillator frequency signal of the local oscillator 13 for $10^{-5}$ sec. The preset counter circuit 16 and the programmable counter 21 are both comprised of four decade counters. Although this invention has been described in connection with an FM receiver, it can also be applied to an AM receiver.

What is claimed is:
1. A radio receiver comprising:
local oscillator means for producing a local frequency signal;
mixer means for producing an intermediate frequency signal by mixing said local frequency signal from said local oscillator means with a broadcast signal received by said receiver;
detector means coupled to said mixer means for demodulating said intermediate frequency signal;
computing means connected to receive said local frequency signal for computing an algebraic sum of a number corresponding to the local frequency of said local oscillator means and a fixed number corresponding to the intermediate frequency, said algebraic sum representing tuned frequency information of said receiver;
counter means for counting clock pulses within a range between numbers corresponding to upper and lower limits of a receiving frequency band of said receiver, a count of said counter means representing broadcast frequency information to be received by said receiver;

comparing means for comparing the count of said counter means with output information from said computing means;

means coupled to said comparing means for controlling the oscillating frequency of said local oscillator means in response to said comparing means by shifting the oscillating frequency of said local oscillator means when said tuned frequency information from said computing means is not coincident with said broadcast frequency information from said counter means, and fixing the oscillating frequency of said local oscillator means when said tuned frequency information from said computing means is coincident with said broadcast frequency information from said counter means;

clock pulse generating means for supplying said clock pulses to said counter means so as to shift said broadcast frequency information from said counter means;

tuning detecting means coupled with said detector means for detecting that said receiver is tuned to the broadcast signal; and means responsive to said tuning detecting means to disable said counter means from counting said clock pulses from said clock pulse generating means when said receiver is tuned to the broadcast signal.

2. A radio receiver selectively operable in a station search mode or a station select mode comprising:

local oscillator means for producing a local frequency signal;

mixer means for producing an intermediate frequency signal by mixing said local frequency signal from said local oscillator means with a broadcast signal received by said receiver;

detector means coupled with said mixer means for demodulating said intermediate frequency signal;

computing means connected to receive said local frequency signal for computing an algebraic sum of a number corresponding to the local frequency signal from said local oscillator means and a fixed number corresponding to the intermediate frequency, said algebraic sum representing tuned frequency information of said receiver;

memory means for storing frequency information for broadcast signals to be received by said receiver;

programmable counter means for counting clock pulses within a range between numbers corresponding to upper and lower limits of a receiving frequency band of said receiver in the station search mode, and programming therein frequency information for a broadcasting signal read out of said memory means in the station select mode;

means for supplying clock pulses to said programmable counter means in the station search mode;

comparing means for comparing the output of said programmable counter means with the output of said computing means;

control means for controlling the local frequency of said local oscillator means in response to said comparing means;

tuning detecting means coupled with said detector means to detect that said receiver is tuned to a broadcasting signal; and means for stopping the supply of said clock pulses to said programmable counter means in response to said tuning detecting means when said receiver is tuned to the broadcasting signal in the station search mode.

3. The radio receiver according to claim 1 or 2, in which said local oscillator means is a voltage-controlled frequency-variable oscillator.

4. The radio receiver according to claim 1 or 2, in which said local oscillator means is a motor-driven frequency-variable oscillator.

5. A radio receiver according to claim 1 or 2, further comprising a switch and means for supplying one signal pulse to said counter means every time said switch is operated.

6. A radio receiver according to claim 1 or 2, in which said computing means includes a presettable counter for counting the local frequency signal from said local oscillator means for a given time from a preset value corresponding to the intermediate frequency.

* * * * *